United States Patent [19]

Conner

[11] Patent Number: 5,274,796
[45] Date of Patent: Dec. 28, 1993

[54] TIMING GENERATOR WITH EDGE GENERATORS, UTILIZING PROGRAMMABLE DELAYS, PROVIDING SYNCHRONIZED TIMING SIGNALS AT NON-INTEGER MULTIPLES OF A CLOCK SIGNAL

[75] Inventor: George W. Conner, Newbury Park, Calif.

[73] Assignee: Teradyne, Inc., Boston, Mass.

[21] Appl. No.: 876,082

[22] Filed: Apr. 28, 1992

Related U.S. Application Data

[63] Continuation of Ser. No. 521,272, May 9, 1990, abandoned, which is a continuation of Ser. No. 12,815, Feb. 9, 1987, abandoned.

[51] Int. Cl.[5] ............................................. G06F 1/08
[52] U.S. Cl. ................................... 395/550; 364/270; 364/270.2; 364/270.3; 364/271; 364/217.5; 364/Dig. 1
[58] Field of Search ... 364/200 MS File, 900 MS File, 364/ DIG. 1, DIG. 2; 395/550

[56] References Cited

U.S. PATENT DOCUMENTS

| 4,079,456 | 3/1978 | Lunsford et al. | 364/200 |
| 4,130,866 | 12/1978 | Ono | 364/200 |
| 4,217,639 | 8/1980 | Hartley et al. | 364/200 |
| 4,231,104 | 10/1980 | St. Clair | 364/900 |
| 4,386,401 | 5/1983 | O'Brien | 364/200 |
| 4,428,042 | 1/1984 | Niethhammer et al. | 364/200 |
| 4,482,983 | 11/1984 | Slechta, Jr. | 364/900 |
| 4,564,953 | 1/1986 | Werking | 377/52 |
| 4,779,221 | 10/1988 | Magliocco et al. | 364/900 |
| 4,789,835 | 12/1988 | Herlein | 328/72 |
| 4,806,852 | 2/1989 | Swan et al. | 324/73 R |

Primary Examiner—Thomas C. Lee
Assistant Examiner—Maria N. Von Buhr

[57] ABSTRACT

A system for providing a plurality of synchronous timing signals having period values that are not even multiples of the clock period including a plurality of local edge generators receiving the clock signals, each local generator including local programmable means to count clock signals and provide local outputs upon receiving predetermined clock signals and local programmable delay means for providing a timing signal after a delay interval following each local output, the resolution of the local delay means being greater than that of the clock.

9 Claims, 1 Drawing Sheet

TIMING GENERATOR WITH EDGE GENERATORS, UTILIZING PROGRAMMABLE DELAYS, PROVIDING SYNCHRONIZED TIMING SIGNALS AT NON-INTEGER MULTIPLES OF A CLOCK SIGNAL

This application is a continuation of application Ser. No. 521,272, filed May 9, 1990 of George W. Conner, for "TIMING GENERATOR," now abandoned, which is a continuation of application Ser. No. 012,815 filed Feb. 9, 1987, of George W. Conner, for "TIMING GENERATOR," now abandoned.

FIELD OF THE INVENTION

The invention relates to generating timing signals.

BACKGROUND OF THE INVENTION

Stable clocks such as crystal oscillators have been used to generate a sequence of timing signals of variable signal-to-signal interval by programming digital counters to trigger the timing signals at predetermined counts of the clock. Although tapped delay lines having resolution (e.g., 1 nanosecond) higher than that (e.g., 16 ns) of the clock have been used to additionally delay signals relative to the start of the sequence, timing signal interval resolution has in such systems been limited by the clock resolution, with the timing signal period equal to the crystal oscillator period or an integer multiple thereof.

In St. Clair U.S. Pat. No. 4,231,104, desired period values that were not even multiples of the crystal period were obtained by dividing the desired period into a number of crystal periods plus a remainder and a residue value, which was added by a delay line. The remainder was simply the remainder of dividing the desired period by the crystal period (e.g., 2 ns remainder for dividing a 50 ns desired period by a 16 ns clock period). The residue values accounted for the fact that subsequent output pulses were not beginning at a clock signal. (E.g., if the first 50 ns period output appears 2 ns after a clock signal, the next output will have this 2 ns residue in addition to the 2 ns remainder, and will appear 4 ns after a clock signal, in order to be 50 ns after the preceding output). A plurality of timing edge generators, employing further delay lines, were driven by these desired period output pulses plus delayed clock signals, obtained by passing clock signals through a delay line delayed by the residue value. The circuitry employing the timing edge generators thus had both the crystal clock signals and asychronous delayed clock signals distributed through it.

In some other timing signal generators, desired periods that are other than integer multiples of a crystal oscillator period are provided by splitting the clock signals into plural phases, and programmably selecting signals from a particular phase to trigger an output (e.g., a 4 ns clock split into four phases to obtain 1 ns resolution)

SUMMARY OF THE INVENTION

It has been discovered that, by distributing crystal clock signals directly to local timing edge generators and selecting a desired clock signal and adding the residue and remainder delay (to come up with pulses having periods other than integer multiples of the clock period) in the edge generators near the final pulse used for edge generation, using local programmable counting and delay means, important advantages would be obtained. Specifically, the timing system would be synchronous (promoting simplicity of manufacture and reliable operation); transmission line inaccuracies would not contribute to timing inaccuracies; there would be reduced crosstalk (owing to the need to distribute only one crystal phase), and there would be a small number of gates (which tend to distort signals) between the clock signal and the final timing signal, yielding improved accuracy.

In preferred embodiments the local programmable counting means includes a local counter and a coincidence detector that receives the output of the local counter plus the output of a first random access memory (RAM) including the most significant bits of the desired period value (i.e., the integer number of clock periods in a desired period); a local end-of-count (LEOC) output is provided at a predetermined count to a flip flop that is triggered upon the next clock signal in order to select a desired clock signal, and that output is provided to the local programmable delay means that adds the residue and remainder values; the programmable delay means includes a delay line that is controlled with a residue and remainder value provided from an adder that obtains the remainder value (also referred to as the least significant bits) from a second RAM and adds to it the residue of the prior output, both RAMs being addressed by the same address bus; there is a master counter that counts clock signals and provides master end-of-count (MEOC) pulses to reset the local counters; there also are master RAMs that include the most significant bits and remainder values for the desired period and adders that are used to calculate the residue value and distribute it to the local edge generators; and the local edge generators include adders which are used to add deskew values (used to account for differences in transmission paths to and through various edge generators) to the residue and remainder values, the summation being used to provide the delay period in the programmable delay line. A preferred application of the invention is automatic circuit testing equipment in which test patterns are provided to a large number of input nodes of a circuit under test at high speed.

Other advantages and features of the invention will be apparent from the following description of a preferred embodiment thereof.

DESCRIPTION OF THE PREFERRED EMBODIMENT

The preferred embodiment will now be described.

DRAWINGS

STRUCTURE

Figure 1:
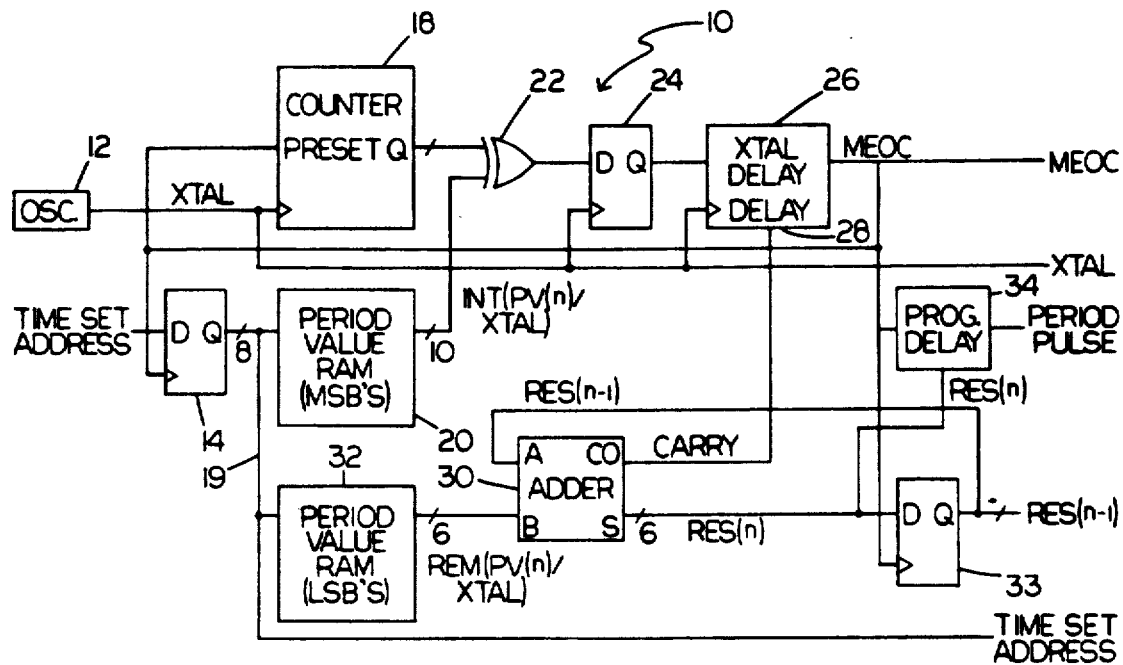
FIG. 1 is block diagram of a period oscillator circuit used to provide master end-of-count pulses and residue values to a plurality of local edge generators.
Figure 2:
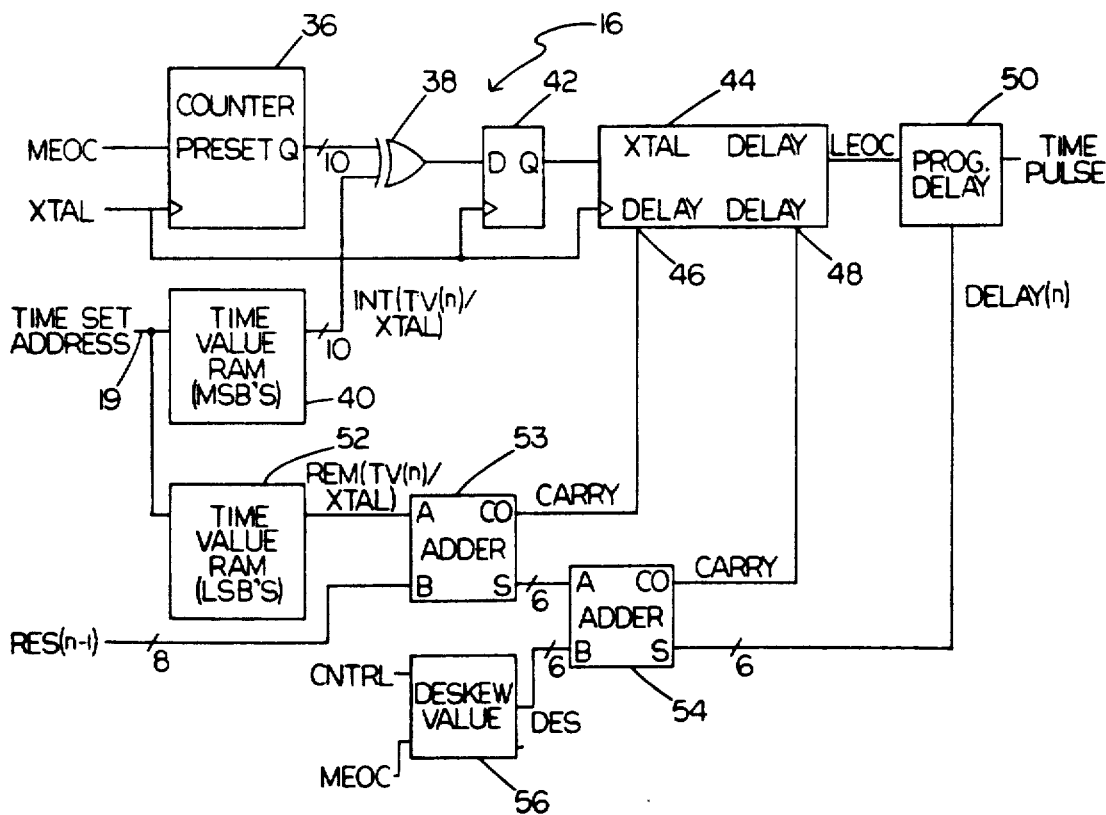
FIG. 2 is a block diagram of a local edge generator using clock signals and the master end-of-count pulses and residue values of the FIG. 1 circuit to generate a timing edge pulse.

Referring to the figures, in FIG. 1 is shown master period oscillator 10, which receives as inputs the clock signals (XTAL) from 6.4 nanosecond crystal oscillator 12 and 8-bit time set addresses (for stored desired period values) and provides outputs used by the plurality of local edge generators 16, one of which is shown in FIG. 2. The timing circuitry shown in the FIGURES is used in an automatic circuit tester in which test patterns are provided to a large number of input nodes of a circuit under test at high speed and the resulting outputs are detected and compared with expected output Referring to FIG. 1, period oscillator 10 includes presetable 10-bit master counter 18 and MSB period value random access memory (RAM) 20 (10-bit by 256-bit), the outputs of both of which are provided for comparison at coincidence detector 22 (plural exclusive or gates, the outputs of which are combined by or gates), to provide an output to flip flop 24 when the count at counter 18 matches the period value at the output of RAM 20. MSB RAM 20 is addressed by addresses provided over 8-bit time set address bus 19 from address register 14. Flip flop 24 is clocked by XTAL signals and provides its output to crystal delay 26, which is also clocked by XTAL signals and can delay its output by 1 XTAL signal when it receives a carry out signal on its delay input 28 from 6-bit residue adder 30. Time set address bus 19 is also provided to LSB period value RAM 32 (6 bit by 256 bit) and provides its output to the B input of residue adder 30. The 6-bit, S summation output, designated RES(n), of residue adder 30 is connected to the input of register 33, which provides its 6-bit output, designated RES(n-1), to local edge generators 16 and to the A input of residue adder 30. The S summation output of residue adder 30 is also provided to programmable delay line 34, which provides an output period pulse each time it receives a master end-of-count (MEOC) pulse from crystal delay 26, after delaying it a delay interval indicated by RES(n). Programmable delay line 34 is a digital interpolator that has 100 ps resolution and can provide delays up to 6.4 ns. The MEOC output of crystal delay 26 is also provided to reset master counter 18 and to clock address register address 14.

Referring to FIG. 2, local edge generator 16 includes presetable 10-bit local counter 36, which is reset by MEOC pulses, clocked by XTAL signals, and provides its 10-bit output to coincidence detector 38, which also receives as an input the output of MSB time value RAM 40 (10-bit by 256-bit). The output of coincidence detector is provided to flip flop 42, which is clocked by XTAL signals and provides its output to crystal delay 44, which is also clocked by XTAL signals. Crystal delay 44 includes two delay inputs 46, 48, each of which is capable of delaying the local end-of-count (LEOC) output of crystal delay 44 to programmable delay line 50 by 1 XTAL signal. Delay input 46 is connected to receive a carry out signal from 6-bit residue adder 53, and delay input 48 is connected to receive a carry out signal from 6-bit delay adder 54. LSB time value RAM 52 (6-bit by 256-bit) is also addressed by time set address bus 19 and provides its output, designated REM(TV(n)/XTAL), to the A input of residue adder 53. The B input of residue adder 53 receives the RES(n-1) output from master period oscillator 10, and the 6-bit S summation output of residue adder 53 is provided to the A input of delay adder 44. The B input of adder 54 receives a deskew value, DES, from deskew value generator 56 in order to deskew the edge provided by edge generator 16 so that it is synchronous with edges provided by edge generators for other channels. Generator 56 is reset by MEOC and receives control signals, CNTRL, indicating a deskew value to be used. The 6-bit S summation output (designated DELAY(n)) of delay adder 54 is provided by programmable delay line 50, which is a digital interpolator having 100 ps resolution and provides an output Pulse each time it receives a pulse from crystal delay 44, after delaying it a delay interval indicated by the value of DELAY(n).

Operation

In operation, period oscillator 10 provides period pulses having programmed period values for cycle n, PV(n), that are other than integer multiples of the crystal period, similar to the operation described in St. Clair U.S. Pat. No. 4,231,104. However, the residue value is not used to delay crystal signals, to which are added further delays in the edge generators, as in St. Clair; instead the crystal signals, the residue value, and the digital master end-of-count signal are sent to all of the local edge generators 16, in which all delay is added to the crystal signal at once.

Referring to FIG. 1, the integer values (designated INT(PV(n)/XTAL) in FIG. 1), of dividing PV(n) by the crystal period (XTAL) are loaded into MSB period value RAM 20, and the remainder values (in 100 ps increments) of this division (designated REM(PV(n)/XTAL) in FIG. 1) are loaded into LSB period value RAM 32. PV(n) can range from 19.2 ns (a minimum of three crystal periods are needed to accommodate routing through the circuitry to perform calculations) to 6.5 microseconds ($2^{10}$ crystal periods) and is one of the 256 values stored in RAM's 20, 32. The period value, PV(n), is thus a summation of the integer values loaded in RAM 20 (in clock period units), and the remainder values loaded into RAM 32 (in 100 ps units). Master counter 18 counts XTAL signals and provides its output to coincidence detector 22, which provides a pulse to flip flop 24 when the count on counter 18 equals the integer values provided by MSB RAM 20. This is provided to flip flop 24, which on the next XTAL signal provides a pulse to crystal delay 26, which on the next XTAL signal (unless delayed by a carry out at input delay 28) provides an MEOC pulse, which resets counter 18 and clocks time set address register 14 to provide the next time set address to RAMs 20, 32. The remainder value provided from LSB RAM 32 to residue adder 30 is added to the value at input A and provided as a sum, RES(n), to delay line 34 and register 33. Time delay line 34 provides a period pulse each time it receives an MEOC pulse, after delaying it by the RES(n) value. Register 33 upon receiving an XTAL signal, provides its output, designated RES(n-1), to indicate that it is one MECC cycle behind the input to register 33. The RES(n) value provided by residue adder 30 to programmable delay 34 and to register 33 has the value of the last 6 bits given by the following equation $$RES(n)=RES(n-1)+REM(PV(n)/XTAL)$$

where:
 PV(n)=Programmed Period Value for cycle n,
 XTAL=Crystal Period Value,
 REM(x/y)=remainder of dividing x by y, and
 RES(n)=Residue for the nth cycle (RES(0)=0).

Thus, if it is the beginning cycle, RES(n) simply equals the remainder value that was provided by LSB RAM 32. In subsequent cycles, RES(n) equals the summation of this value plus the residue value from the preceding cycle, fed back from the output of register 33. In this manner period pulses with values PV(n) that are other than integer values of the period of oscillator 12 are Provided by counting an integer number of clock signals to obtain an MEOC pulse and delaying the MEOC pulse by the remainder value in the first cycle and delaying the MEOC by the sum of the remainder and residue values in subsequent cycles, to account for the fact that the prior period Pulse was not synchronous with a clock signal. Because the oscillator has a 6.4 ns period, and programmable delay 34 adds delays in increments of 100 ps, when residue adder 30 has counted to 64, it will overflow and provide a carry out, and the MEOC will once again be synchronous with the crystal signal, so a one-crystal-signal delay is provided at crystal delay 26. The period pulse is used by a pattern generator (not shown) to send the next cycle's data to be formatted.

Referring to FIG. 2, edge generator 16 receives MEOC pulses, XTAL signals, addresses on time set address bus 19, and the RES(n-1) residue values from period oscillator 10. The MEOC pulses reset counter 36, which counts XTAL signals and provides its output to coincidence detector 38. The time value for edge generator 16 for cycle n, TV(n), is split up into some integer number of crystal periods (designated INT(TV(n)/XTAL)) plus a remainder value (designated REM(TV(n)/XTAL) in RAMs 40, 52, as was the period value. When the value of the output of counter 36 matches the integer values in MSB time value RAM 40, a pulse is provided to flip flop 42, which provides a pulse to crystal delay 44 upon the next XTAL signal. The remainder value, REM(TV(n)/XTAL). is provided to the A input to 6-bit adder 53 which adds to this the residue value, RES(n-1), provided from oscillator 10. The 6-bit summation of these values is then provided to delay adder 54, which adds in any deskew value, DES, from deskew value generator 56. The summation of these values is then provided to programmable delay line 50. The delay value thus is determined by the the last 6 bits of the number provided by the following equation:

$$DELAY(n) = RES(n-1) + REM(TV(n)/XTAL) + DES$$

where:

TV(n) = Programmed Time Value for cycle n, and
DES = deskew for local edge generator 16.

As in period oscillator 10, crystal delay 44 provides its LEOC pulse to programmable delay 50, which adds to it a delay interval, here DELAY(n). The two delay inputs 46, 48 are used when 6-bit adders 53, 54 overflow and provide carry outs. The output of programmable delay line 50 is a timing edge pulse, which is used to generate an edge, used, e.g., with an edge from another local edge generator to provide a data pulse to a digital circuit being tested by automatic test equipment employing the timing signal generator. Thus the time value TV(n) may differ from the period values PV(n), depending upon, e.g., whether the time pulse is a beginning edge or an ending edge and the desired Pulse width. The DES values provide deskew that varies depending upon the path to and through the generator, whether the edge is used for rising or falling edges and whether it is used in a driver or a detector.

There are substantial advantages associated with providing pure crystal signals to local edge generators and adding all delays at once. The timing system is totally synchronous so that it is simple to manufacture and reliable in operation. Only a pure crystal is fanned out to the system so that transmission line inaccuracies do not contribute to timing inaccuracies; residue and remainder delays are distributed and added in the digital domain. Because there is only one crystal phase, crosstalk is reduced. Deskewed values are easily added in the digital domain rather than the analog domain. There are an absolute minimum of gates between the pure crystal signal and the final timing signals, yielding improved accuracy by avoiding having the ultimate timing signals based upon signals that have passed through a plurality of gates, each of which adds some distortion.

OTHER EMBODIMENTS

Other embodiments of the invention are within the scope of the following claims. E.g., the timing system would have application in circuitry other than multiple-channel automatic circuit testors, in particular circuitry requiring precise timing edges that can be varied on a cycle-by-cycle basis.

What is claimed is:

1. A system for providing a plurality of synchronous timing signals having period values that are not even multiples of a clock period comprising
   a clock for generating clock signals separated in time by a clock period, and
   a plurality of local edge generator connected by respective paths to said clock receiving said clock signals, each said local edge generator including
   local programmable counting means to provide local outputs upon receiving predetermined clock signals,
   said local programmable counting means including a first random access memory (RAM) loaded with integer numbers of clock periods in predetermined time values, said integer numbers corresponding to said predetermined clock signals,
   means for generating a deskew value to correct for a particular delay in said respective path between said edge generator and said clock, and
   local programmable delay means for providing a timing signal after a delay interval following each said local output, said local programmable delay means having a resolution,
   said local programmable delay means including a deskew circuit for receiving said deskew value,
   said deskew circuit providing a delay control signal based on said deskew value to said local programmable delay means so that said timing signal is synchronous with timing signals of other local edge generators,
   the resolution of said local programmable delay means being greater than that of said clock,
   said local programmable delay means including a delay line providing said timing signal and a second RAM loaded with remainder values of a division of said predetermined time values by said clock period, said second RAM being connected to provide said remainder values to said deskew circuit for generating said delay control signal, the system further comprising a common address bus connected to said first and second RAMs in each of said local generators.

2. The system of claim 1 wherein said local programmable counting means includes a local counter that counts clock signals and produces an output related to said counted clock signals and a coincidence detector that compares the output of the local counter with an integer number of clock periods corresponding to a desired time value and provides an output to a flip flop, said flip flop being triggered on an immediately following clock signal to provide said local output.

3. The system of claim 2 wherein said coincidence detector is connected to receive said integer number from said first RAM.

4. A system for providing a plurality of synchronous timing signals having period values that are not even multiples of a clock period comprising a clock for generating clock signals separated in time by a clock period, and a plurality of local edge generators connected by respective paths to said clock receiving said clock signals, each said local edge generator including local programmable counting means to provide local outputs upon receiving predetermined clock signals, means for generating a deskew value to correct for a particular delay in said respective path between said edge generator and said clock, and local programmable delay means for providing a timing signal after a delay interval following each said local output, said local programmable delay means having a resolution, said local programmable delay means including a deskew circuit for receiving said deskew value, said deskew circuit providing a delay control signal based on said deskew value to said local programmable delay means so that said timing signal is synchronous with timing signals of other local edge generators, the resolution of said local programmable delay means being grater than that of said clock, wherein said local programmable counting means includes a local counter that counts clock signals and produces an output related to said counted clock signals and a coincidence detector that compares the output of the local counter with an integer number of clock periods corresponding to a desired time value and provides an output to a flip flop, said flip flop being triggered on an immediately following clock signal to provide said local output, wherein said local programmable counting means includes a first random access memory loaded with integer numbers of clock periods in predetermined time values and wherein said coincidence detector is connected to receive said integer number from said first RAM, wherein said local programmable delay means includes a delay line providing said timing signal and a second RAM loaded with remainder values of a division of said predetermined time values by said clock period, said second RAM being connected to provide said remainder values to said deskew circuit for generating said delay control signal, the system further comprising a common address bus connected to said first and second RAMs in each of said local generators.

5. The system of claim 4 wherein each said local edge generator comprises means for generating residue values, and wherein said programmable delay means includes a first adder for adding a residue value to a said remainder value to provide a sum as said delay control signal to said delay line.

6. The system of claim 5 wherein said deskew circuit includes a deskew adder for adding said deskew value to the residue and remainder values to provide a sum as said delay control signal to the delay line.

7. The system of claim 6 wherein said means for generating said deskew value is provided by a deskew generator that can vary the deskew value on a cycle-by-cycle basis.

8. A system for providing a plurality of synchronous timing signals having period values that are not even multiples of a clock period comprising a clock for generating clock signals separated in time by a clock period, and a plurality of local edge generators connected by respective paths to said clock receiving said clock signals, each said local edge generator including local programmable counting means to provide local outputs upon receiving predetermined clock signals, means for generating a deskew value to correct for a particular delay in said respective path between said edge generator and said clock, and local programmable delay means for providing a timing signal after a delay interval following each said local output, said local programmable delay means having a resolution, said local programmable delay means including a deskew circuit for receiving said deskew value, said deskew circuit providing a delay control signal based on said deskew value to said local programmable delay means so that said timing signal is synchronous with timing signals of other local edge generators, the resolution of said local programmable delay means being greater than that of said clock, wherein there is a master control circuit that includes said clock and provides master end-of-count pulses and residue values to the local edge generators, said master end-of-count pulses being used to reset said local programmable counting means, said residue values being used by said local programmable delay means in generating said delay control signal.

9. The system of claim 8 wherein said master control circuit is a period oscillator including master programmable counting means to provide master end-of-count outputs upon receiving predetermined clock signals and master programmable delay means for providing a period output signal after a delay interval following each said master end-of-count output, said master programmable delay means having a resolution, the resolution of said master programmable delay means being grater than that of said clock.

* * * * *

UNITED STATES PATENT AND TRADEMARK OFFICE
CERTIFICATE OF CORRECTION

PATENT NO. : 5,274,796

DATED : December 28, 1993

INVENTOR(S) : George W. Conner

It is certified that error appears in the above-identified patent and that said Letters Patent is hereby corrected as shown below:

Column 1, line 45, "output)." should be --output.)--;

Column 1, line 59, "tion)" should be --tion).-- ;

Column 2, line 68, "FIGURES" should be --figures--;

Column 3, line 4, "output" should be --output.--;

Column 4, line 1, "Pulse" should be --pulse--;

Column 4, line 46, insert --,-- after "33";

Column 4, line 48, "MECC" should be --MEOC--;

Column 4, line 52, insert --:-- after "equation";

Column 4, line 68, "Provided" should be --provided--;

Column 5, line 5, "Pulse" should be --pulse--;

Column 5, line 29, "." should be --,--;

Column 5, line 30, the second "to" should be --of--;

Column 5, line 57 "Pulse" should be --pulse--;

UNITED STATES PATENT AND TRADEMARK OFFICE
CERTIFICATE OF CORRECTION

PATENT NO. : 5,274,796
DATED : December 28, 1993
INVENTOR(S) : George W. Conner

It is certified that error appears in the above-identified patent and that said Letters Patent is hereby corrected as shown below:

Column 6, line 15, "testors" should be --testers--;

Column 6, line 24, "generator" should be --generators--;

Column 7, line 45, insert --(RAM)-- after "memory";

and

Column 8, line 57, "grater" should be --greater--;

Signed and Sealed this

Seventh Day of June, 1994

*Attest:*

BRUCE LEHMAN

*Attesting Officer*          *Commissioner of Patents and Trademarks*